United States Patent [19]

Ohkawa et al.

[11] Patent Number: 5,525,831
[45] Date of Patent: Jun. 11, 1996

[54] SEMICONDUCTOR DEVICE WITH THIN FILM RESISTOR HAVING REDUCED FILM THICKNESS SENSITIVITY DURING TRIMMING PROCESS

[75] Inventors: Makoto Ohkawa, Toyoake; Makio Iida, Ichinomiya; Shoji Miura, Nukata-gun; Osamu Ishihara; Tetsuaki Kamiya, both of Nagoya, all of Japan

[73] Assignee: Nippondenso Co., Ltd., Kariya, Japan

[21] Appl. No.: 222,815

[22] Filed: Apr. 5, 1994

[30] Foreign Application Priority Data

Apr. 5, 1993 [JP] Japan .................................. 5-078009
Jun. 23, 1993 [JP] Japan .................................. 5-151871

[51] Int. Cl.$^6$ .......................... H01L 29/00; H01L 29/76; H01L 23/58
[52] U.S. Cl. .......................... 257/543; 257/536; 257/640; 257/637; 257/379
[58] Field of Search .................................... 257/543, 379, 257/536, 538, 380, 635, 640, 637, 350

[56] References Cited

U.S. PATENT DOCUMENTS

| | | | |
|---|---|---|---|
| 3,717,514 | 2/1973 | Burgess | 257/637 |
| 4,063,275 | 12/1977 | Matsushita et al. | 257/640 |
| 4,069,487 | 1/1978 | Kasai et al. | 346/135 |
| 4,217,570 | 8/1980 | Holmes | 338/308 |
| 4,288,776 | 9/1981 | Holmes | 338/308 |
| 4,594,265 | 6/1986 | Van Vonno et al. | 427/102 |
| 4,665,295 | 5/1987 | McDavid | 427/53.1 |
| 4,708,747 | 11/1987 | O'Mara, Jr. | 437/19 |
| 4,823,181 | 4/1989 | Mohsen et al. | 257/640 |
| 5,284,794 | 2/1994 | Isobe et al. | 437/173 |
| 5,382,916 | 1/1995 | King et al. | 330/253 |

FOREIGN PATENT DOCUMENTS

| | | |
|---|---|---|
| 199388 | 10/1986 | European Pat. Off. . |
| 0350961 | 1/1990 | European Pat. Off. . |
| 0443575 | 8/1991 | European Pat. Off. . |
| 9000384 | 7/1970 | Japan ............. 257/637 |
| 2207809 | 8/1988 | United Kingdom .......... 257/538 |
| 0004736 | 8/1986 | WIPO ....................... 257/637 |

OTHER PUBLICATIONS

"Electronic Packaging & Interconnection Handbook". pp. 7.13–7.16. Charles A. Harper.
IBM Technical Disclosure Bulletin, "Method To Form Polysilicon Resistors Along With High–Performance Transistors", vol. 23 No. 12 May 1981, Jambot Kar.
Patent Abstracts of Japan, vol. 9, No. 53, Mar. 7, 1985, & JP–A–59 193 022.
J. C. North, "Laser Vaporization of Metal Films–Effect of Optical Interference in Underlying Dielectric Layer", Journal of Appl. Phy., vol. 48, No. 6, Jun. 1977, pp. 2419–2423.
M. J. Mueller, "Functional Laser Trimming of Thin Film Resistors on Silicon ICs", SPIE, vol. 611, Laser Processing of Semiconductors and Hybrids (1986), pp. 70–75.
A. Fischer et al, "Laser Trimming of NiCr Thin Film Resistors II: Thin Film Resistors with an $SiO_2$", Protective Layer, 2194 Thin Solid Films, 182, Dec. 20, 1989, pp. 35–45.
V. Schultze et al, "Laser Trimming of NiCr Thin Film Resistors I: Thin Film Resistors Without a Protective Layer", 2194 Thin Solid Films, 1982, Dec. 20, 1989, pp. 23–33.

Primary Examiner—Sara W. Crane
Assistant Examiner—Jhihan Clark
Attorney, Agent, or Firm—Cushman, Darby & Cushman

[57] ABSTRACT

A thin film resistor on a semiconductor device may be laser trimmed while reducing the influence of film thickness of a passivation film formed on the thin film resistor. An underlying oxide film consisting of a BPSG film and a silicon oxide film is formed on an Si substrate. A silicon oxide film and a silicon nitride film are formed on the underlying film as a passivation film, and a silicon oxide film is formed on this assembly. The silicon oxide film contributes to controlling a variation of the laser energy absorption rate of a thin film resistor due to an uneven thickness of the silicon nitride film. Thus, it is possible to stabilize adjustment of the resistance value of the thin film resistor with a laser.

18 Claims, 11 Drawing Sheets

THICKNESS OF SILICON NITRIDE FILM (nm)

THICKNESS OF SILICON NITRIDE FILM (nm)

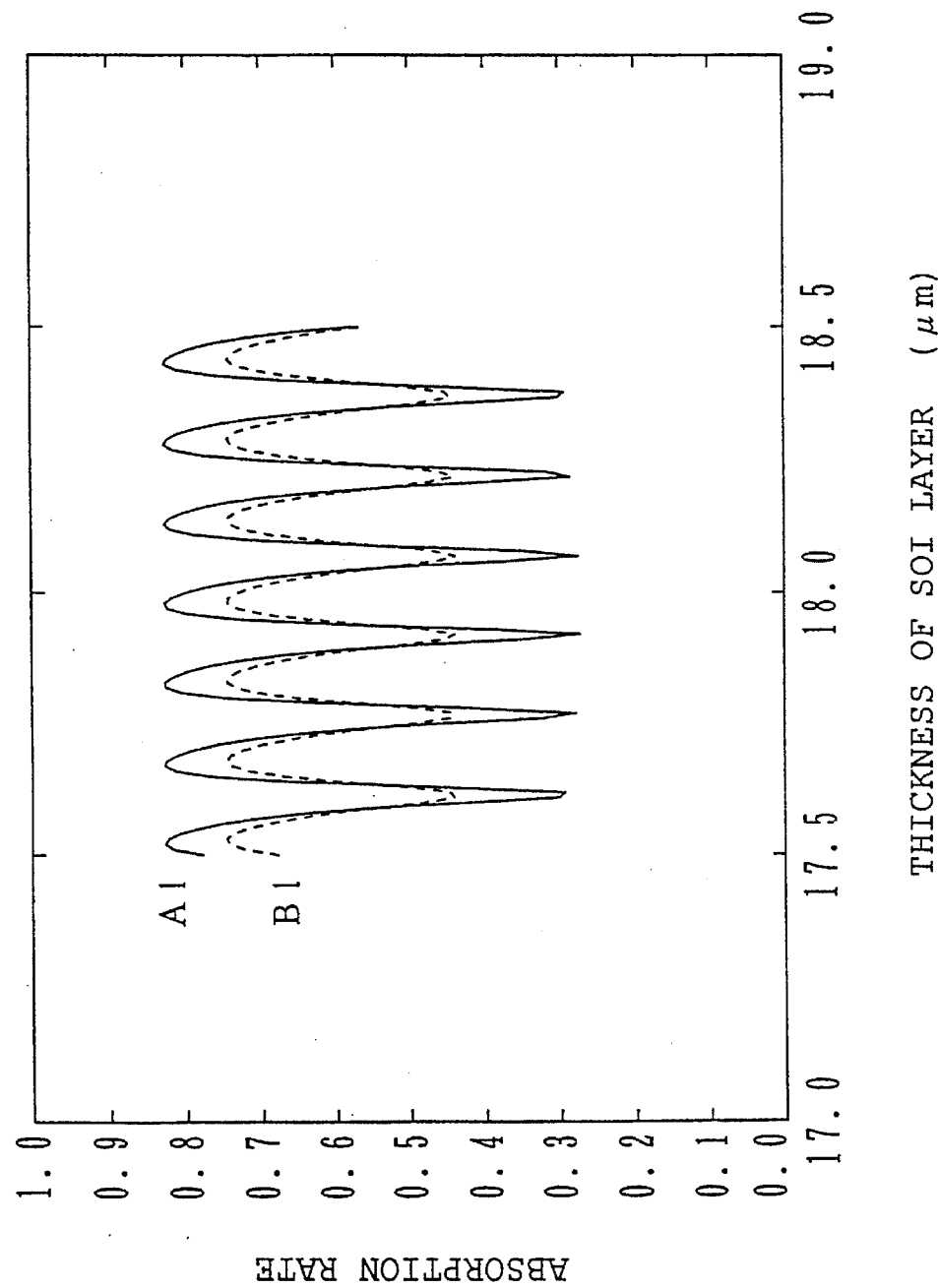

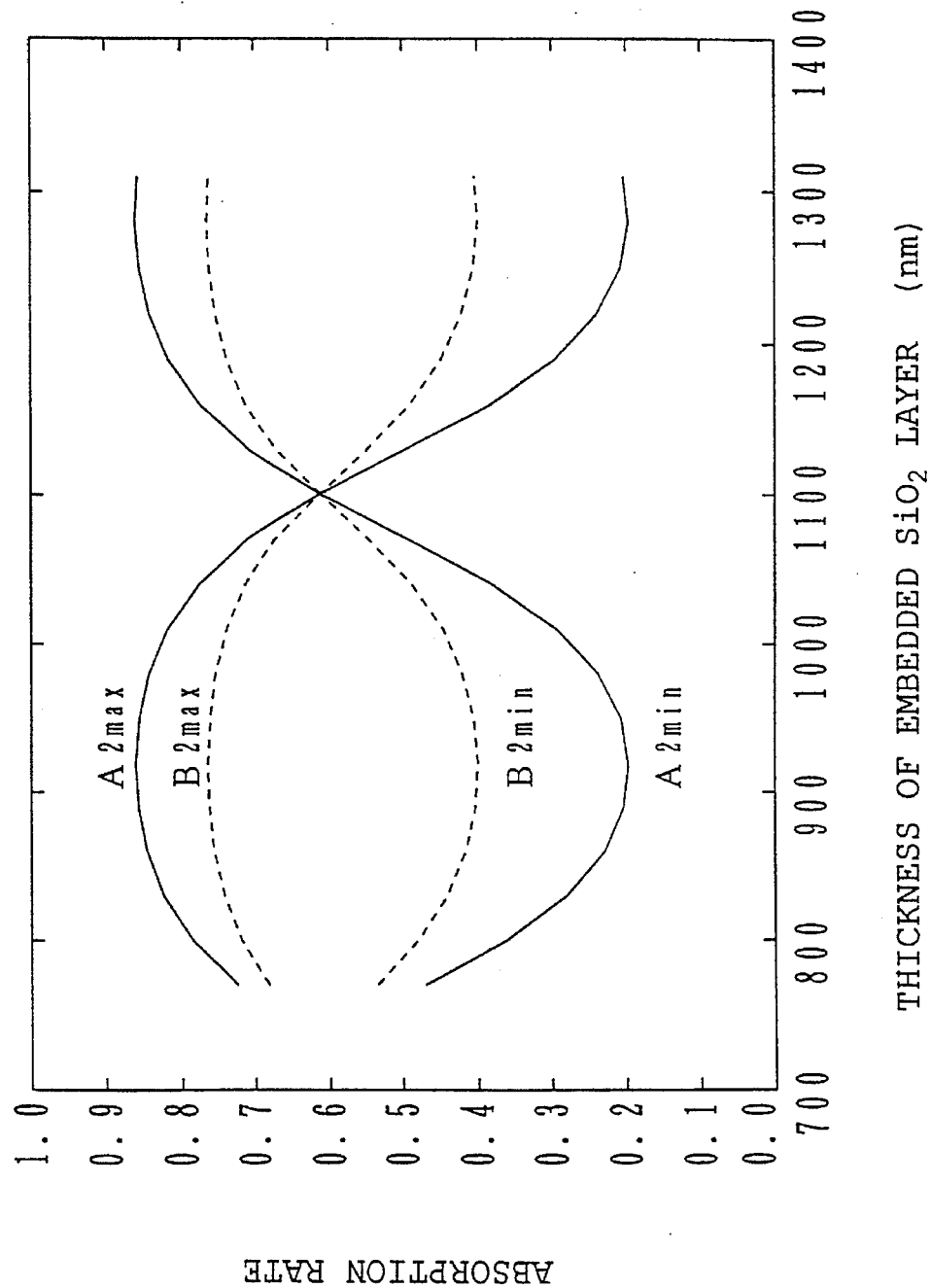

SEMICONDUCTOR DEVICE WITH THIN FILM RESISTOR HAVING REDUCED FILM THICKNESS SENSITIVITY DURING TRIMMING PROCESS

BACKGROUND OF THE INVENTION

1. Field of the Invention

The present invention relates to a semiconductor device having a thin film resistor whose resistance value is adjusted by means of laser trimming.

2. Description of the Related Arts

Hitherto, integration of a thin film resistor on a semiconductor substrate has made it possible for a semiconductor device to be made smaller and less costly. For adjustment of the resistance value of the thin film resistor, a laser trimming method is generally used which adjusts a resistance value by fusing the thin film resistor with laser beams irradiated on it. Also, a two-layered passivation film is used for the protection of the thin film resistor, as proposed, for instance, U.S. Pat. No. 4,217,570. As shown in FIG. 1, a silicon oxide film 3 is formed on the thin film resistor 4 for the trimming capability, and a silicon nitride film 2 is formed on the silicon oxide film 3 for the environmental resistance. FIG. 1 also shows a silicon substrate 6, an underlying oxide film 5 such as silicon oxide film, and an aluminum electrode 7.

An important thing for the laser trimming process is to adjust the quantity of laser energy absorbed by the thin film resistor to an optimum level. If the absorbed energy is too little, the thin film resistor will fuse insufficiently, and if it is excessive, the insulating films or semiconductor substrate will be damaged.

In FIG. 1, the laser beams transmitted through thin film resistor 4 are partly reflected by the surface of underlying oxide film 5 and by the surface of silicon substrate 6 and are absorbed again, while interfering with the transmitted light, by thin film resistor 4. There also occur reflections and interference on the surface of thin film resistor 4 and the surfaces of surface passivation film 2 and 3. The total energy of the laser beams absorbed by the thin film resistor 4 varies depending on the thickness of each film composing a semiconductor device. Therefore, an optimum adjustment of the thickness of each film is required to perform laser trimming in a stabilized manner.

However, due to such factors as nonuniformity in a production process, film thicknesses can vary for each wafer or for each lot. In EP-A-0 443 575, by holding down the nonuniformity in film thickness by reducing the film thickness of the underlying oxide film at bottom of the thin film resistor and having a film thickness in which it is possible to obtain the largest absorption rate of the laser energy to the thin film resistor, the influence caused by the surface passivation film on top of the thin film resistor is made small, thus enabling performance of a trimming with a certain energy even if the film thickness of the surface passivation film varies due to the nonuniformity in a production process.

In recent years, there is an increasing demand for a semiconductor device which has a higher speed and is more highly integrated. Now, semiconductor elements are formed into silicon-on-insulator (SOI) layer which is isolated by insulating films such as silicon oxide. This makes it possible for the capacity between the substrate and the element to become smaller, thus realizing a higher speed, since they are isolated from each other by an insulating film Furthermore, an isolation by means of an insulating layer reduces the plane size of an element, and a lamination of elements realizes a three dimensional IC, thereby enabling higher integration.

FIG. 2 shows an example in which a thin film resistor is integrated on the semiconductor device which has said SOI structure. As shown in FIG. 2, in the semiconductor device of the SOI structure in which are formed consecutively substrate 61, embedded silicon oxide film 62, silicon layer 63 as an SOI layer, underlying oxide film 5, thin film resistor 4, aluminum electrode 7, silicon oxide film 3 and silicon nitride film 2 as a surface passivation film, when the resistance value is adjusted by laser trimming thin film resistor 4 with YAG lasers (1064 nm in wavelength), the laser beams which have passed through thin film resistor 4 are to be reflected on each interface of the surface of underlying oxide film 5, the surface of silicon layer 63, the surface of embedded silicon oxide film 62 and the surface of substrate 61. The interfering light of these reflected lights and the light incident on thin film resistor 4 each contribute to the laser trimming. However, in the case of the SOI structure as shown in FIG. 2, the light reaching thin film resistor 4 after being reflected at the interface of each layer below the resistor becomes a complicated interfering light of the reflected light at each layer. Consequently, it is very difficult to optimize the film thickness of each layer so as to control the reflected light. In particular, silicon layer 63 which composes the SOI layer is thick in its film, besides having a large refractive index but small periodic film thickness for laser light of 152 nm, and is dependent upon the SOI device which is formed therein irrespective of the laser trimming. On this account, it is difficult to control a variation in the laser energy absorption rate in a thin film resistor by means only of the film thickness.

SUMMARY OF THE INVENTION

An object of the present invention is to provide a semiconductor device which can control a variation in the laser beam energy absorption rate in a thin film resistor without making a particular adjustment of the film thickness below the thin film resistor.

In the present invention, a focus is placed on reducing directly the influence due to a nonuniformity of the thickness of a surface passivation film on the thin film resistor, with its primary feature being that, in a semiconductor device having a thin film resistor which is formed on a substrate and whose resistance value is adjusted by the laser beams, a second passivation film which has a smaller refractive index than that of a first passivation film formed on the thin film resistor is formed on the first passivation film.

In this first structure, since the second passivation film having a small refractive index is formed on the first passivation film, it is possible to restrain the reflection of the laser beams on the surface of the first passivation film. Consequently, it is possible to control a variation in the reflected light due to a nonuniformity in the thickness of the first passivation film, to thereby restrain a variation in interference light caused by the reflected light from the lower interface of the first passivation film and the incident light onto the surface of the first passivation film.

In other words, a variation in the laser beams reaching the thin film resistor can be controlled, a variation in the absorption rate of the laser beam energy in the thin film resistor can be controlled, and, in the laser trimming of the thin film resistor, the influence due to a nonuniformity of the thickness of the passivation film formed on the thin film resistor can be reduced.

The second feature of the present invention is that, in a semiconductor device having an SOI structure, a high impurity concentration region is provided in the SOI layer and a thin film resistor is disposed in the upper part of the high impurity concentration region, in order to reduce the influence of the reflected light from the lower layer of the laser beams which have transmitted the thin film resistor.

In the second structure, a focus is placed in the fact that when an impurity is doped into a semiconductor layer, the absorption rate of near infrared light will rise in the semiconductor layer. According to this structure, since the high impurity concentration region is provided in the semiconductor layer which is formed in the lower part of the thin film resistor, on having the said thin film resistor adjusted for the resistance value by means of the laser beams, the laser beams belonging to the near infrared light which has transmitted through the thin film resistor are better absorbed in the high impurity concentration region. On that account, the reflection of the laser beams at each interface between films located below the semiconductor layer is reduced, with the reflected light reaching the thin film resistor and the interference of incident light with reflected light being controlled, thus stabilizing the laser trimming of the thin film resistor. By dint of that, it becomes easy to adjust the resistance value of the thin film resistor by means of laser beams.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings, of which:

FIG. 10 is a characteristic diagram indicating the dependency on the film thickness of a silicon layer of a laser beam absorption rate in a thin film resistor;

FIG. 11 is a characteristic diagram indicating the dependency on the film thickness of an embedded oxide silicon layer of a laser beam absorption rate in a thin film resistor;

DETAILED DESCRIPTION OF THE EMBODIMENTS

Figure 1:
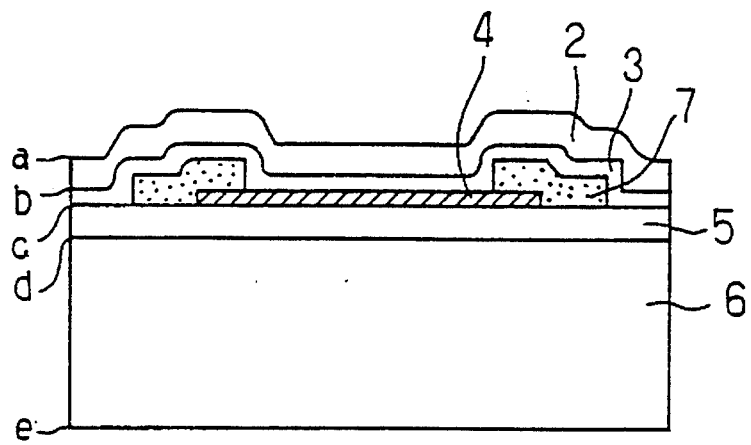
FIG. 1 is a sectional view of a semiconductor device having a thin film resistor according to a conventional structure.

A description of a first embodiment of the present invention will be given below referring to FIG. 3.

In this embodiment, a silicon oxide film is additionally deposited on the surface of the conventional element (See FIG. 1) as a reflection reducing film. Described below is the structure of the present embodiment.

On an Si substrate 6 is formed an underlying film 5 which is composed of a silicon oxide film and a BPSG film, the BPSG film being a silicon oxide film containing boron and phosphorus, and followed by the formation thereon of a thin film resistor 4 which is made of CrSi, then followed by the formation thereon of a TEOS oxide film 3 and a silicon nitride film 2 which is made of P(plasma)-SiN as a two-layered layered passivation film for the thin film resistor, then further followed by the formation thereon of a TEOS oxide film 1. As is known in the art, the term "TEOS" is commonly used for oxides formed by deposition in an environment wherein tetraethoxysilane is flowed over a heated deposition wafer, thus causing pyrolysis of the tetraethoxysilane with the resultant formation of a silicon oxide upon the deposition wafer. Hereinafter, as is commonly understood by those in the art, the term "TEOS" will be taken to include any appropriate TEOS layer, whether or not doped with other element.

The refractive index $n_2$ of the silicon nitride film 2 is 2.0 and the refractive index $n_1$ of the oxide film 1 is 1.45. In this case, the thickness of the TEOS oxide film 1 is set to approximately 183 nm (to be explained later). In FIG. 3, 7 represents an Al electrode.

Figure 4:
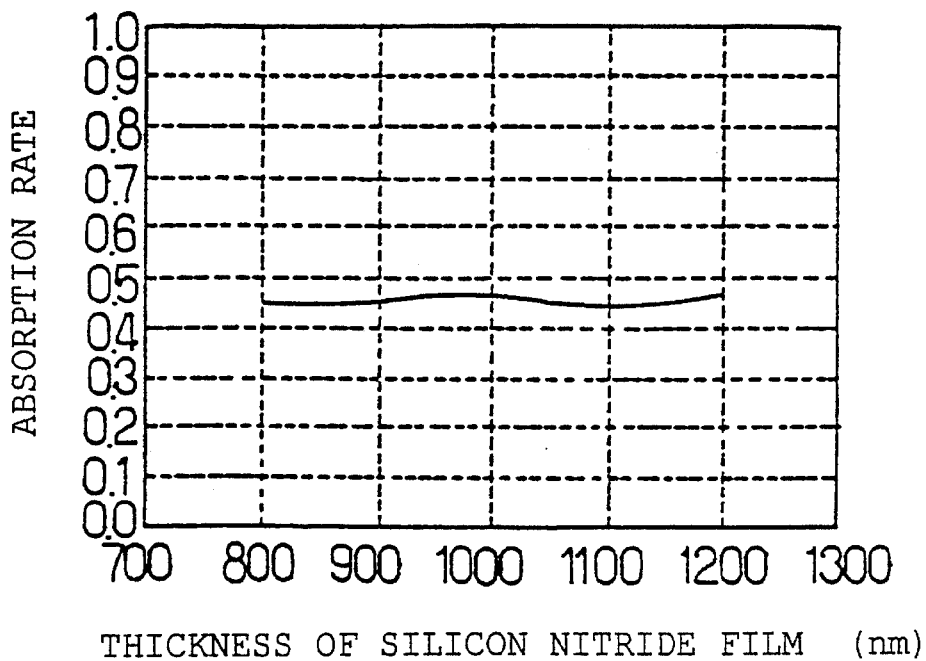
FIG. 4 is a characteristic diagram indicating the dependency on the thickness of a silicon nitride film of a laser beam absorption rate in a thin film resistor in the structure of the first embodiment as shown in FIG. 3.
Figure 5:
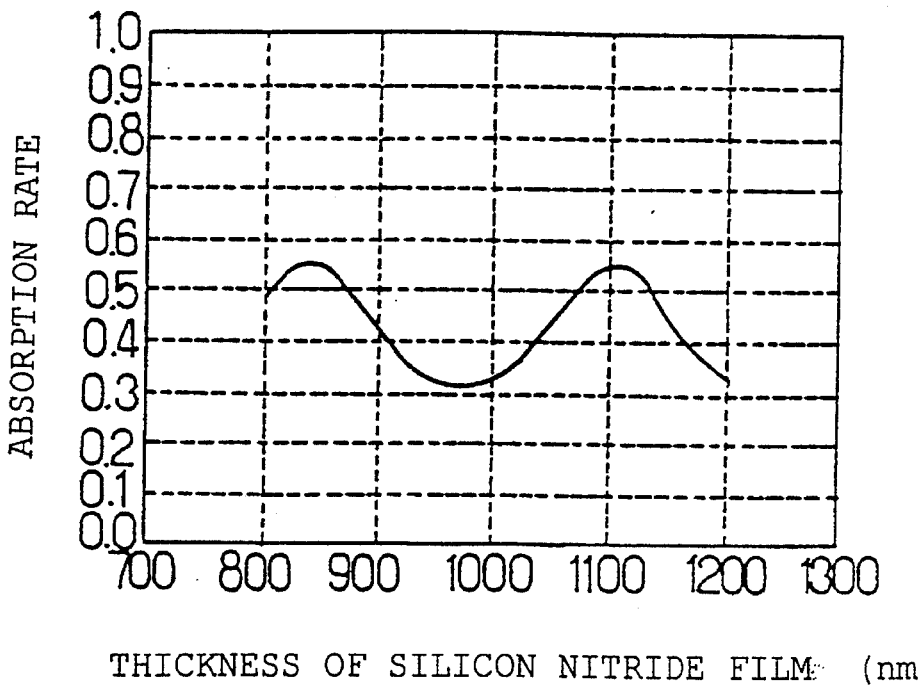
FIG. 5 is a characteristic diagram indicating the dependency on the thickness of a silicon nitride film of a laser beam absorption rate in a thin film resistor in the conventional structure as shown in FIG. 1.

FIG. 4 shows a change in the absorption rate of laser beams at thin film resistor 4 when YAG (Yttrium, Aluminum, Garnet) laser beams (1064 nm in wavelength) are irradiated on the device of the present embodiment. FIG. 5 shows a change in the absorption rate of laser beams at a thin film resistor in the conventional structure shown in FIG. 1.

In the conventional case in which silicon nitride film 2 is used for a passivation film in the topmost surface, due to a large refractive index approximately 2.0 of the silicon nitride film, the energy of the laser beams absorbed by thin film resistor 4 varies a great deal, as shown in FIG. 5, on account of the thickness of silicon nitride film 2. A low absorption rate of the energy of the laser beams at thin film resistor 4, which results from the variation, gives rise to a problem that a trimming cannot be performed. This phenomenon will be described below based on the nature of light.

As is the nature of light, the energy of laser beams incident on a plane parallel plate is divided into three conditions of reflection R on the surface of the plane parallel plate, absorption A and transmission T on the plane parallel plate. That is, the sum of these three conditions is equivalent to the energy of incident laser beams. Let the energy of incident laser beams be 1, and we have the following expression:

$$A+T+R=1 \quad (1)$$

And, in a multi-layer film, a reflected light $R_0$ on the surface thereof becomes the interfering light of reflected lights ($R_1$, $R_2$, $R_3$, ...) from the interface of each layer. Accordingly, as can be understood from the expression (1), as the reflected light $R_0$ varies, so does the laser beams incident on the multi layer film. As shown in FIG. 1, in the case of the multi-layer film composed of silicon nitride film 2, silicon oxide film 3, thin film resistor 4, underlying oxide film 5 and silicon substrate 6, the reflected light $R_0$ can be considered as a interfering light of the reflection at the surface of silicon nitride film 2, i.e., reflected light $R_1$ from the interface of "a," with the reflected lights $R_2$, ... from the interfaces below that of "b," "c," "d," "e." In case where the laser beams which perform a trimming of thin film resistor 4 are YAG laser beams 1064 nm in wavelength, the reflected light $R_0$, which is an interfering light, is affected by a variation in the thickness of silicon nitride film 2, and changes in a cycle of about 266 nm, as shown in FIG. 5. In fact, the thickness of a silicon nitride film 2 shown in FIG. 1 is approximately 1 μm, and a variation in a film of that much thickness is approximately 200 nm to 300 nm. Consequently, in the structure of a device shown in FIG. 1, the reflected light $R_0$ is subject to a variation in the thickness of silicon nitride film 2, and, as described above, the laser beams reaching the thin film resistor 4 vary, and also the absorption rate of the energy of the laser beams at thin film resistor 4 varies, as shown in FIG. 5.

Figure 3:
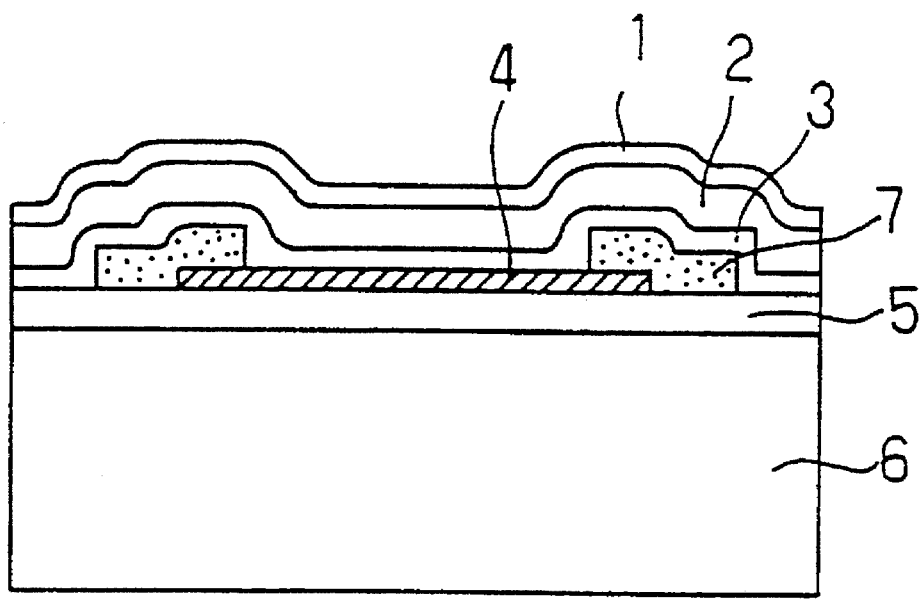
FIG. 3 is a sectional view of a semiconductor device having a thin film resistor, for which a first embodiment is applied.

On the other hand, according to the embodiment as shown in FIG. 3, since the silicon oxide film 1 (TEOS oxide film) which has a smaller refractive index than a silicon nitride film is formed on the silicon nitride film 2, it is possible to restrain the reflected light on the surface of the silicon nitride film 2. This makes it possible to restrain a variation in the reflected light due to an interference of the reflected light from each interface of the layers beneath the silicon nitride film with the reflected light from the surface of the silicon nitride film. That is, a variation in the reflected light due to the thickness variation of the silicon nitride film 2 can be minimized. On this account, it is possible to restrain a variation in the laser beams reaching the thin film resistor 4, and, as shown in FIG. 4, it is also possible to restrain a variation in the absorption rate of the energy of the laser beams at thin film resistor 4. A comparison of FIG. 4 with FIG. 5 will show that the embodiment in which the silicon oxide film 1 is formed on the silicon nitride film 2 is smaller in the variation in the energy of the laser beams at the thin film resistor against the change in the thickness of the silicon nitride film. Accordingly, in the laser trimming of a thin film resistor, an influence from a thickness variation of a silicon nitride film can easily be reduced.

As can be seen from the above, in a case where a silicon oxide film is formed on a silicon nitride film, it is possible to hold down a variation in the absorption rate of the energy of the laser beams at the thin film resistor due to a variation in the thickness of a silicon nitride film. Now, the optimization of the thickness of a silicon oxide film formed on a silicon nitride film is considered. An optimum thickness of a silicon oxide film is given when the reflection of laser beams on the surface of a silicon nitride film is minimal. We have the Rouard method in which a piece of a single layer film is replaced consecutively from bottom for a vertical incident light with a single face equivalent to it. In this method, it is possible to replace the reflectance at the upper and lower interface of a single layer film with one expression. In this method, it is the same whether begins with the bottom single layer or with the top single layer. We will adopt here the Rouard method beginning with the top single layer.

In a two-layered film, the refractive index of the upper layer is $n_1$, the film thickness is d, the refractive index of the lower layer is $n_2$, and the refractive index of air is $n_0$. In this case, if $n_1$ is smaller than $n_2$, the reflectance is always smaller when there is an upper film. Suppose also that the wavelength of irradiating laser beams used for trimming is λ, and when the following expression is satisfied:

$$n_1 d = \lambda/4 = m\lambda/2 \pm \lambda/8 \quad (m=0, 1, 2, ...) \quad (2)$$

(wherein ±λ/8 is tolerance)
the reflectance when the upper layer film is replaced by a face according to the Rouard method is:

$$R_1 = ((n_1^2 - n_2 n_0)/(n_1^2 + n_2 n_0))^2 \quad (3)$$

and reflectance $R_1$ is minimal. Therefore, if the single layer film which is replaced by a face by applying the method to the present embodiment is taken for silicon oxide film 1 on silicon nitride film 2, the reflection on the surface of the silicon nitride film 1 can be made minimal, when the thickness of the silicon oxide film is that which is given by the expression (2). In the case of the present embodiment, since YAG laser beams (1064 nm) are used for the trimming laser beams, the optical thickness of silicon oxide film 1 is 183 nm. FIG. 4 illustrates the case when silicon oxide film 1 is formed in the extent of this thickness. On this occasion, based on the refractive index $n_1 = 1.45$ of the oxide film, the refractive index $n_2 = 2.0$ of the silicon nitride film and the the refractive index $n_0 = 1$, the reflectance is, from the expression (3), $R_1 = 6.2 \times 10^{-4}$, which is a value far smaller than 0.11, the reflectance of a silicon nitride film alone.

Furthermore, the laser trimming of a thin film resistor is of course affected not only by the surface of a passivation film such as a silicon nitride film but also by the thickness of an underlying oxide film 5 which is composed of BPSG film and silicon oxide film below the thin film resistor 4. The influence from the underlying oxide film 5 is, as mentioned-above, instability of the trimming due to a variation in its film thickness. To solve this matter, unless a measure is taken for controlling the thickness of the underlying oxide film 5, trimming energy must be increased. However, the increase of the energy gives rise to a problem of surface passivation films such as silicon nitride film and silicon oxide film being damaged.

Figure 6:
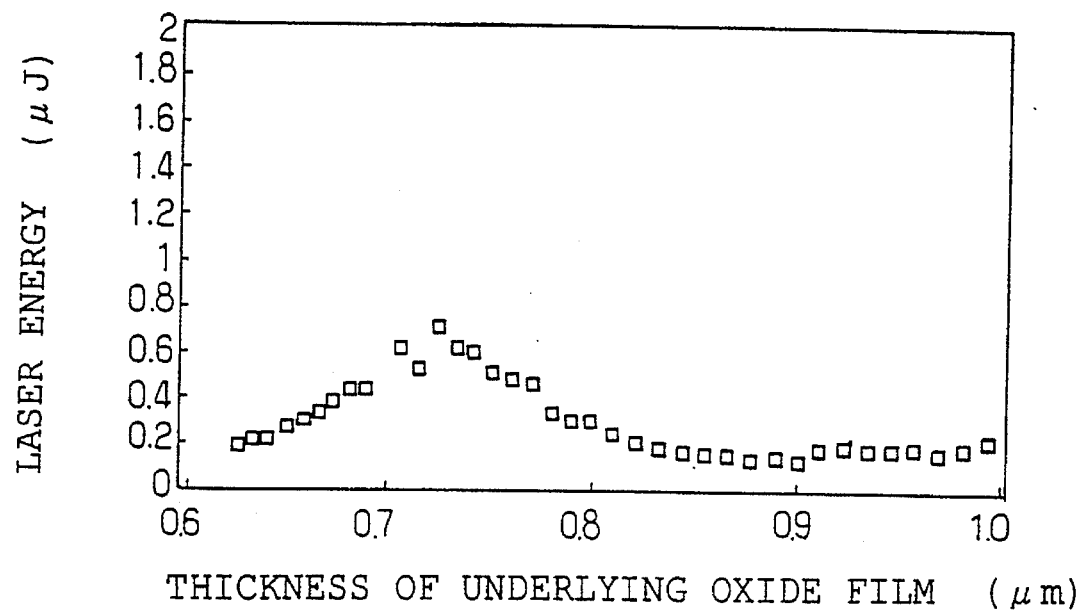
FIG. 6 is a characteristic diagram indicating the relationship between the laser energy required for trimming and the thickness of an underlying oxide film in the structure of the first embodiment as shown in FIG. 3.
Figure 7:
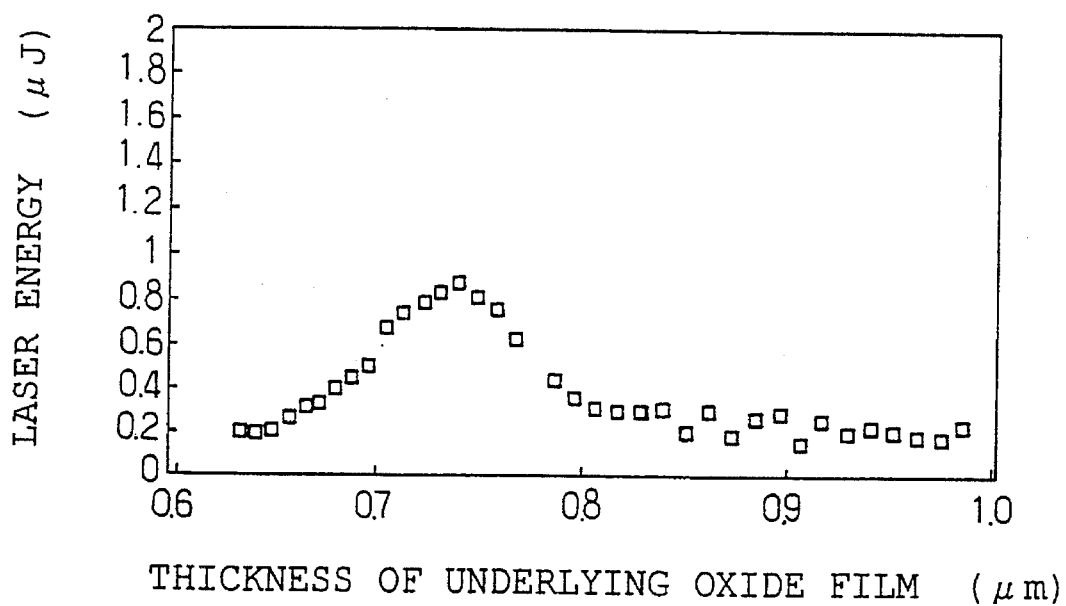
FIG. 7 is a characteristic diagram indicating the relationship between the laser energy required for trimming and the thickness of an underlying oxide film in the conventional structure as shown in FIG. 1.

In view of the above, the inventors of the present invention have made a comparison of the influence of underlying oxide film 5 in terms of the magnitude of the irradiated laser energy required for trimming between the device with an oxide film on the silicon nitride film as in the case of the first embodiment and the device without an oxide film as in the case of the conventional structure. The results are shown in FIGS. 6 and 7. FIG. 6 is for the case of the first embodiment and FIG. 7 is for the case of the conventional structure (FIG. 1). The film thicknesses are 177 nm for TEOS oxide film 1, a film of low refractive index, 1 µm for silicon nitride film 2, a passivation film, and 820 nm for TEOS oxide film 3. As can be seen from FIGS. 6 and 7, the device in the present embodiment is smaller and more stabilized in the trimming energy as against a variation in the thickness of the underlying oxide film 5. They show, namely, that the formation of the oxide film 1 (small in the refractive index) on silicon nitride film 2 is effective in reducing the influence from the underlying oxide film 5 when performing a laser trimming of thin film resistor 4.

Moreover, in the case of there being a passivation film on a thin film resistor, the equivalent effect can be obtained by forming a film on top of it which has a lower refractive index than the passivation film, regardless of the structure beneath the thin film resistor.

Figure 8:
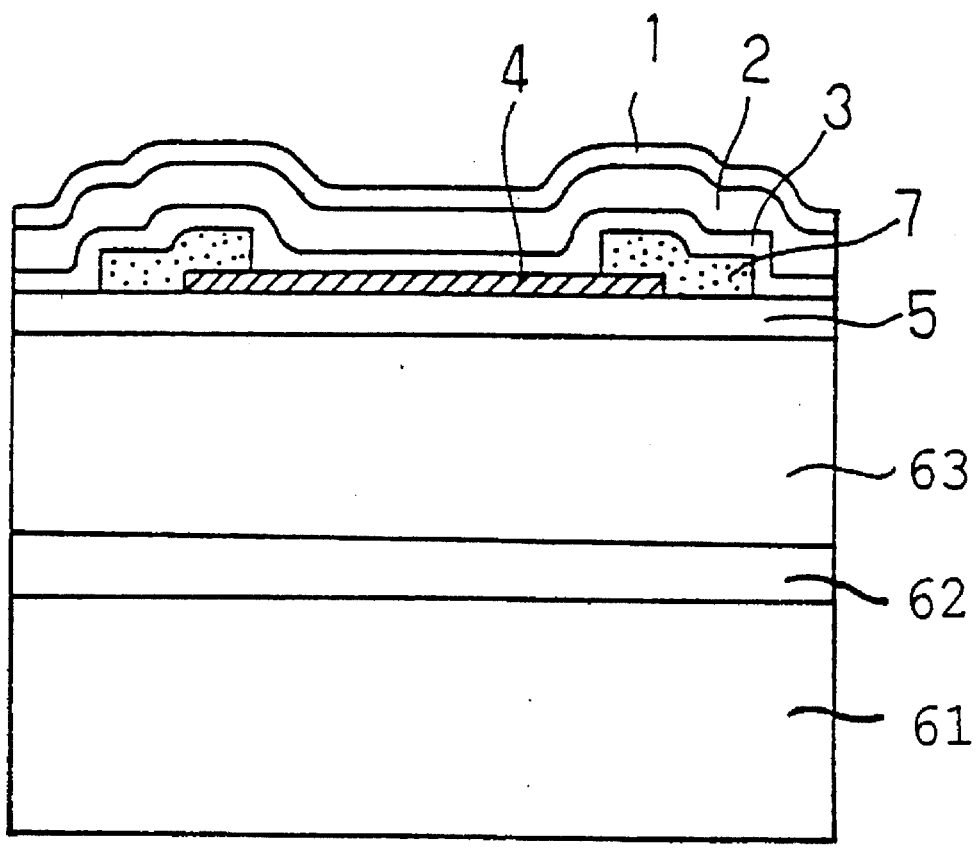
FIG. 8 is a sectional view of a semiconductor device having a thin film resistor, for which a second embodiment is applied.

FIG. 8 shows, for instance, a second embodiment which is applied for an SOI substrate. That is, even when a thin film resistor 4 is formed on a silicon substrate 61 through a silicon layer 63 and an embedded silicon oxide film 62, the same effect as that obtained in the first embodiment can be obtained by forming an oxide film 1 on a silicon nitride film 2, the former having a smaller refractive index than the latter.

Figure 9A:
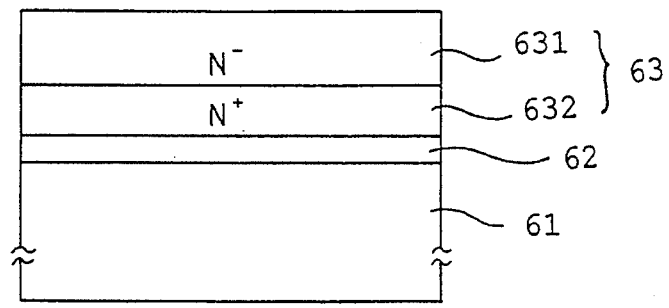
FIGS. 9A, 9B, and 9C are diagrams to be used for describing the production process, with the sectional view shown of a semiconductor device having a thin film resistor, for which a third embodiment is applied.

A description will be given below of a semiconductor device having an SOI structure for which a third embodiment of the present invention is applied in the order of the production processes shown in FIGS. 9A through 9C. Note that in FIGS. 9A through 9C only the region in which the thin film resistor is disposed is shown, and on silicon layer (SOI layer) 63 in the region not indicated are formed semiconductor elements such as bipolar transistor.

First, an Si substrate 61 is thermally oxidized, thereby forming a 1 µm oxide film, that is, embedded $SiO_2$ layer 62. An $N^+$ diffusion layer 632 (impurity concentration of $10^{18}$ $cm^{-3}$), approximately 3.5 µm in depth, is formed at the surface of an $N^-$ type substrate 63 by introducing antimony (Sb). Then, as shown in FIG. 9A, these substrates 61 and 63 are bonded at a high temperature (1000° C.) and polished from the side of the $N^-$ type layer for the thickness of 18 µm.

Figure 9B:
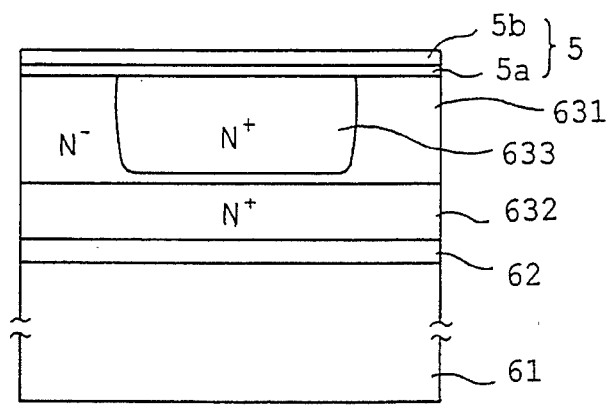

Next, as shown in FIG. 9B, a patterning is performed according to a photolithography technique, and phosphorus ions are doped into the polished surface of the $N^-$ type layer 631 according to an ion implantation process. After that, a heat treatment is performed and to diffuse the phosphorus ions to form $N^+$ diffusion layer 633, 8 µm in depth and approximately $5 \times 10^{19}$ $cm^{-3}$ in impurity concentration. This substrate 63 formed with the $N^+$ diffusion layer 633 and the $N^+$ diffusion layer 632 are equivalent to the silicon layer as the SOI layer. Next, the surface of the substrate 63 is thermally oxidized, and, silicon oxide film 5a is formed for approximately 100 nm, and, on top of it is formed approximately 800 nm of silicon oxide film (BPSG) 5b which contains boron and phosphorus by means of the chemical vapor deposition (CVD). Silicon oxide film 5a and BPSG film 5b are equivalent to the underlying oxide film 5.

Figure 9C:
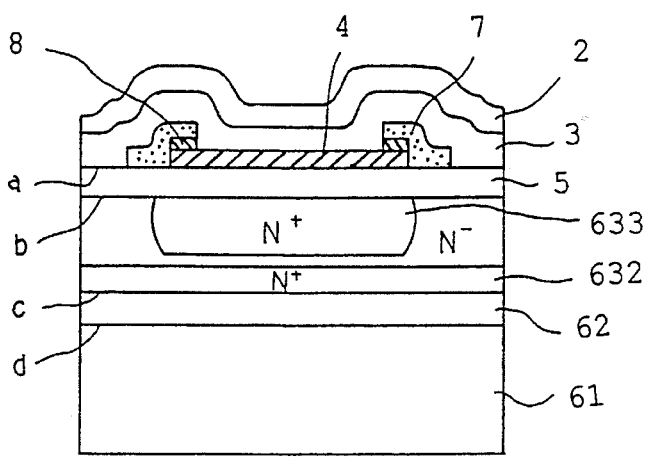

Then, as shown in FIG. 9C, a thin film resistor 4 which is composed of CrSi film is formed for approximately 15 nm according to a sputtering method, and approximately 150 nm of TiW film 8 is formed for the protection of CrSi film when the Al electrode is patterned, and a patterning of TiW film and CrSi film is performed according to the photolithography technique. Next, approximately 900 nm of Al film which contains 1% of Si is formed for use as an electrode according to the sputtering method, and a patterning is performed by means of the photolithography technique and the dry etching technique, and Al electrode 7 is formed. Then, extra TiW film is removed by etching. After that, 800 nm of silicon oxide film 3 is formed for a protection film according to the CVD method in which tetraethoxysilane (TEOS) is the material gas, and 1600 nm of silicon nitride film 2 is also formed according to the plasma CVD method. These silicon oxide film 3 and silicon nitride film 2 are equivalent to a surface passivation film. Lastly an opening for bonding is formed in the surface passivation film in the invisible section of FIG. 9C.

Figure 2:
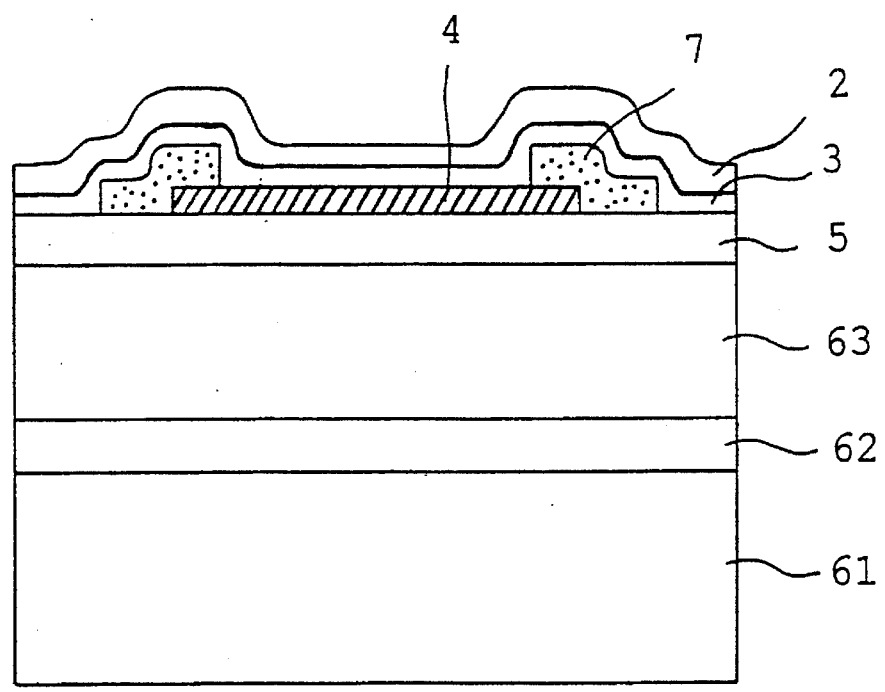
FIG. 2 is a sectional view of a semiconductor device, showing an example in which the structure in FIG. 1 is applied for an SOI structure.
Figure 12:
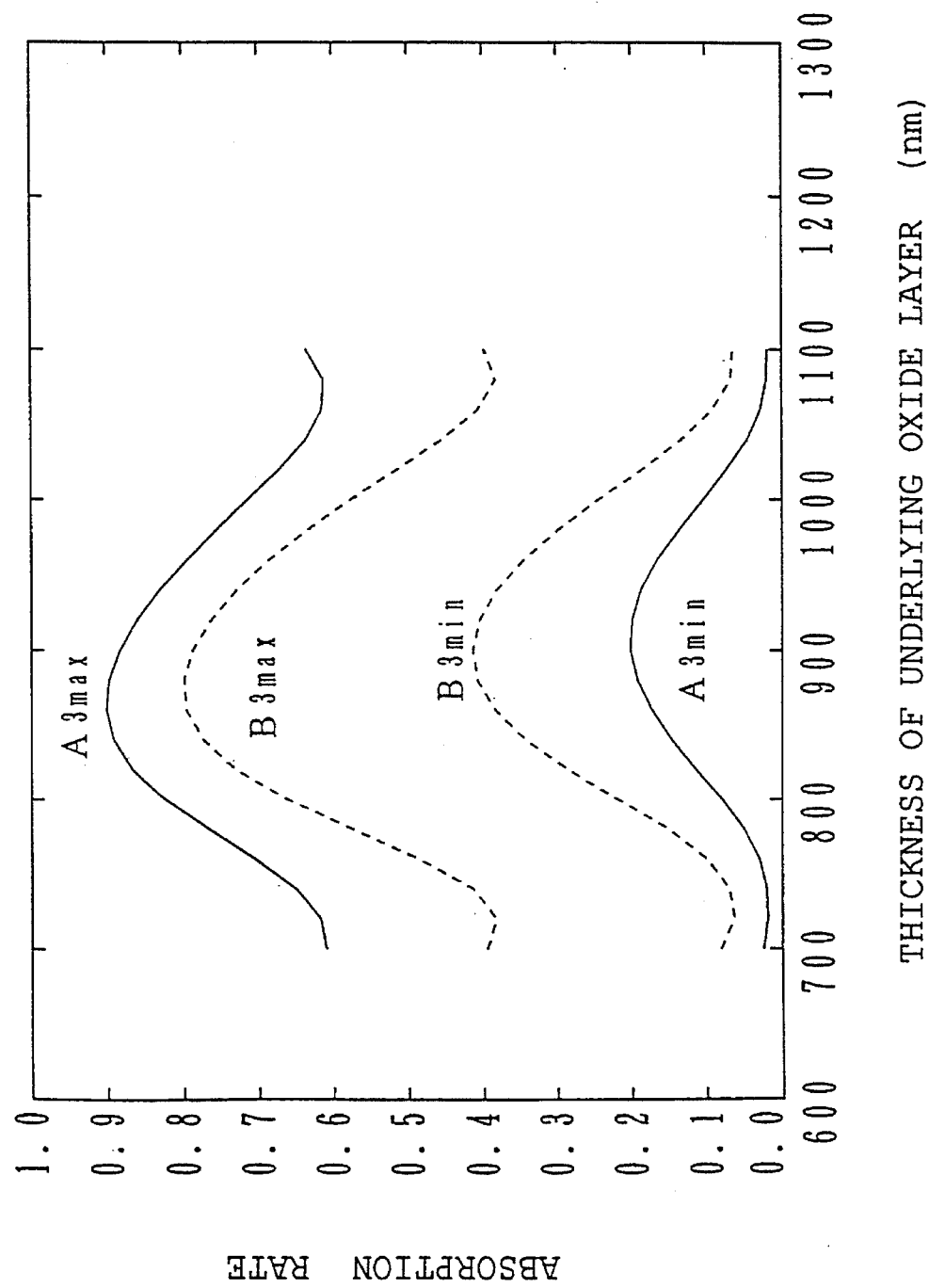
FIG. 12 is a characteristic diagram indicating the dependency on the film thickness of an underlying oxide layer of a laser beam absorption rate in a thin film resistor.

For the device made following the above-mentioned procedure, a variation in the absorption rate of the energy of the laser beams at the thin film resistor given by the variation in the thickness of each film when a laser trimming is performed by means of YAG laser beams is compared with that indicated in FIG. 2 referring to FIGS. 10 through 12. The characteristics of the structure shown in FIG. 2 are represented by "A" and the characteristics in the case of this embodiment are represented by "B."

FIG. 10 is based on the changes in the thickness of silicon film 63 which composes an SOI layer, the absorption rate of the laser beam energy of the device shown in FIG. 2 being indicated by a solid line for characteristics "$A_1$" and the same of the present embodiment being indicated by a dotted line for characteristics "$B_1$." As can be seen from the characteristics "$A_1$" and "$B_1$," a variation of the energy absorption rate is held down to a lower level in the case of this embodiment where silicon layer 63 which composes an SOI is doped with a higher concentration of an impurity.

FIGS. 11 and 12 show the influence on the absorption rate of the energy of the laser beams at thin film resistor 4, given by the changes in the thicknesses of embedded silicon oxide film 62 and underlying oxide film 5, after taking into consideration the influence from silicon film 63. In FIG. 11, the thickness of the underlying oxide film is 920 nm, and, in FIG. 12, the thickness of the embedded silicon oxide film 62 is 917 nm. In FIGS. 11 and 12, characteristics $A_{2max}$, $B_{2max}$ and $A_{3max}$, $B_{3max}$ indicate respectively the influence on the thickness of the embedded silicon oxide film 62 and the underlying oxide film 5 at the thickness of the silicon film 63 when the energy of the laser beams at thin film resistor 4 is maximal. Characteristics $A_{2min}$, $B_{2min}$ and $A_{3min}$, $B_{3min}$ indicate respectively the influence on the thickness of the embedded silicon oxide film 62 and the underlying oxide film 5 at the thickness of silicon film 63 when the energy of the laser beams at thin film resistor 4 is minimal. As can be seen from FIGS. 11 and 12, there is also a influence smaller in the case of this embodiment than in the case shown in FIG. 2. That is given to the absorption rate of the energy at thin film resistor 4.

Next, unevenness of the minimum energy required for a trimming of thin film resistor 4 has been actually measured for the changes in the thickness of silicon layer 63 which exercise the greatest influence upon the unevenness. The data thereof are shown in FIG. 14 for the structure of FIG. 2 and in FIG. 13 for the structure of this embodiment.

Figure 13:
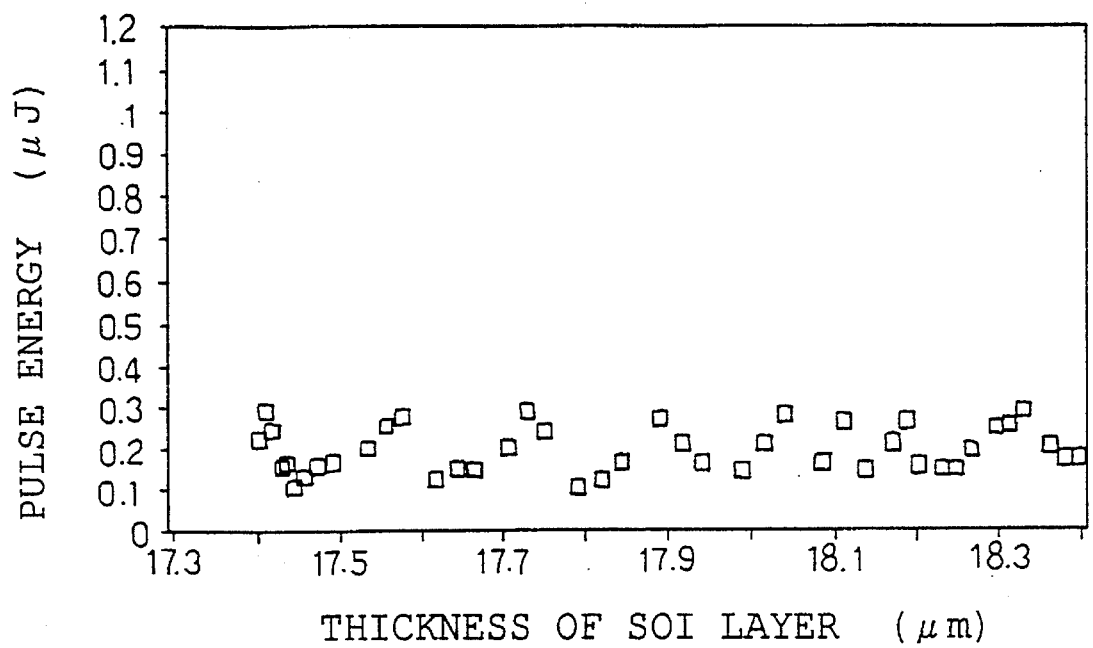
FIG. 13 is a characteristic diagram indicating the relationship between the minimum value of the laser energy required for trimming and the film thickness of a silicon layer in the structure of the third embodiment as shown in FIG. 9C.
Figure 14:
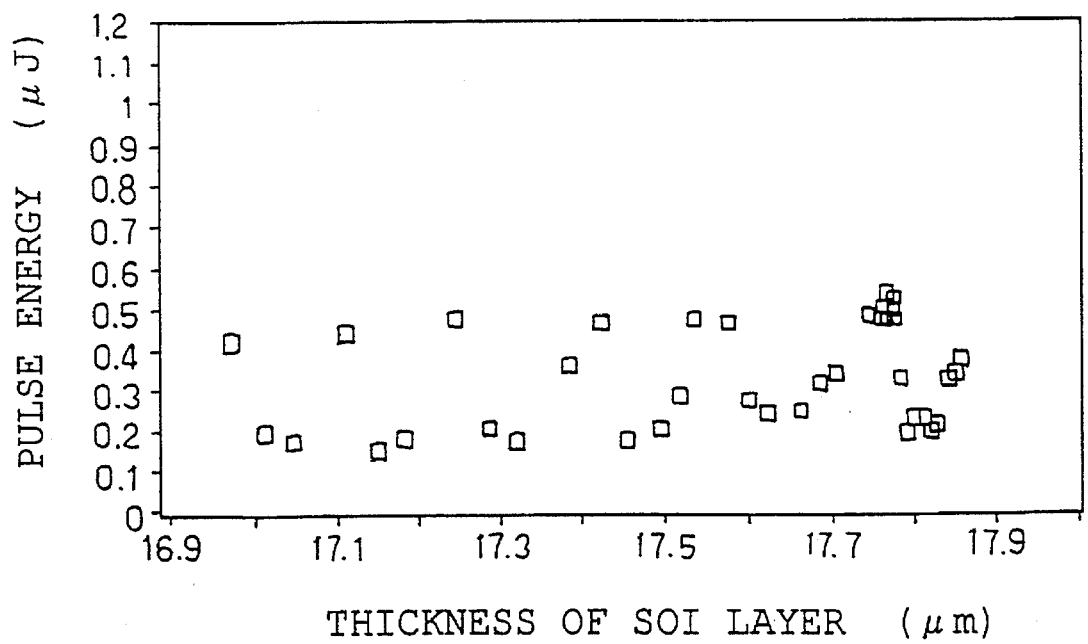
FIG. 14 is a characteristic diagram indicating the relationship between the minimum value of the laser energy required for trimming and the film thickness of a silicon layer in the structure as shown in FIG. 2.

As can be seen from FIGS. 13 and 14, a variation of trimming energy is smaller in the structure of this embodiment than in the structure shown in FIG. 2. As against the structure of FIG. 2, in which a maximum of 0.5 µJ of laser beam energy are required for a change of the thickness of the silicon layer 63, the structure of this embodiment needs only a maximum of 0.3 µJ. Since the energy which damages a surface passivation film is approximately 0.5 µJ, the structure of FIG. 2 could break a surface passivation film, but it is not the case with the structure of this embodiment.

The experiments conducted by the inventors of the present invention have revealed that the absorption rate of trimming energy at thin film resistor 4 may be 20% or more when the energy of laser beams is not so large as to cause damages on a surface passivation film. On this account, in contrast to the fact that it has not been possible to take allowances for variation for the thickness of the underlying oxide film 5 in the structure of FIG. 2, approximately 100 nm of variation allowances can be given to the structure of this embodiment for the target value of 900 nm for the thickness of underlying oxide film 5, when laser beams having as large energy as mentioned above are used. That is, a larger tolerance can be allowed for an unevenness during the process.

As described above, according to this embodiment, since a high impurity concentration region 633 is provided in a silicon layer 63 which composes an SOI layer, taking advantage of a rise of the absorption rate for near infrared light when a silicon is doped with an impurity, YAG laser beams belonging to near infrared light which has passed through a thin film resistor 4 when a laser trimming is performed on the thin film resistor 4, are absorbed to a greater degree by the high impurity concentration region 633 provided in silicon layer 63. On this account, the reflections at interfaces "c" and "d" are restrained, and the reflected light from the under layer of silicon layer 63 is controlled. That is, the reflected light from interface "c" which most affect the absorption of the energy of the laser beams at thin film resistor 4 is controlled. By dint of that, the reflected light reaching thin film resistor 4 can be controlled. Consequently, an interference of incident light with reflected light at the thin film resistor 4 is controlled, and as a result, a variation of the energy of the laser beams absorbed by the thin film resistor 4 can be controlled.

The concentration of the high impurity concentration region 633 is preferably $1 \times 10^{19}$ cm$^{-3}$ or more. And, the diffusion depth of the high impurity concentration region 633 is preferably 3 μm or more.

Moreover, there is virtually no limit to the kind of impurities to be submitted to a high concentration diffusion and the materials for thin film resistors.

Furthermore, for an SOI layer, an N conductive type has been used in this embodiment, however, it may be a P conductive type.

Besides in this embodiment, the present invention is also effective in cases where, for instance, a thermally oxidized film is used for an underlying film instead of BPSG film under a thin film resistor, one layer of silicon oxide film is used for surface passivation film, two or more-layer film is used for surface passivation film, and/or an Sb embedded layer is not formed, and so forth.

Figure 15:
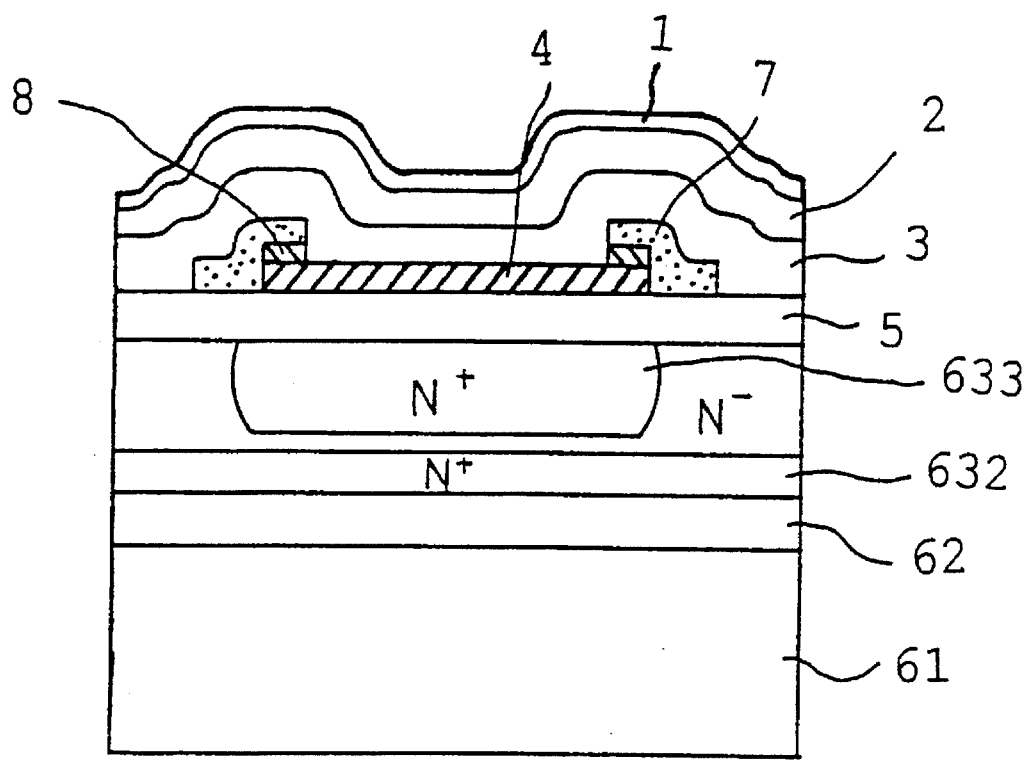
FIG. 15 is a sectional view of a semiconductor device having a thin film resistor, for which a forth embodiment is applied.

In particular, as in the case of a fourth embodiment shown in FIG. 15, a formation of a silicon oxide film 1 having a smaller refractive index on a silicon nitride film 2, a surface passivation film, makes it possible to perform a more stabilized laser trimming of each wafer in every lot, without being subject to an uneven thickness of the surface passivation film as well as controlling the influence of the reflected light from bottom layer of the thin film resistor 4.

What is claimed is:

1. A semiconductor device having a thin film resistor comprising:
    a semiconductor substrate;
    a thin film resistor comprising chromium (Cr) and silicon (Si) disposed on said semiconductor substrate;
    a first passivation film formed on said thin film resistor, said first passivation film being composed of multiple layers comprising a silicon oxide film and a silicon nitride film; and
    a second passivation film formed on said thin film resistor interposing said first passivation film, having a smaller refractive index than said first passivation film.

2. The semiconductor device according to claim 1, wherein said second passivation film is a silicon oxide film.

3. The semiconductor device according to claim 1, wherein a thickness of said second passivation film is approximately 183 nm.

4. The semiconductor device according to claim 2, wherein said semiconductor substrate has a semiconductor layer formed on an insulting film on a substrate.

5. The semiconductor device according to claim 4, wherein said semiconductor layer has a high impurity concentration region provided in the semiconductor layer and under said thin film resistor.

6. A semiconductor device having a thin film resistor comprising:
    a semiconductor substrate;
    a thin film resistor comprising chromium (Cr) and silicon (Si) disposed on said semiconductor substrate;
    a first passivation film comprising a silicon nitride film formed on said thin film resistor; and
    a second passivation film being a silicon oxide film formed on said thin film resistor interposing said first passivation film, having a smaller refractive index than said first passivation film,
    wherein a thickness of said second passivation film is approximately 183 nm.

7. A semiconductor device having a thin film resistor comprising:
    a semiconductor substrate;
    a thin film resistor comprising chromium (Cr) and silicon (Si) disposed on said semiconductor substrate;
    a first passivation film formed on said thin film resistor; and
    a second passivation film formed on said thin film resistor interposing said first passivation film, having a smaller refractive index than said first passivation film,
    wherein a thickness d of said second passivation film satisfies the following expression when a refractive index of said second passivation film is n and a wavelength of laser beams for adjustment a resistance value of said thin film resistor is λ;

$$nd = \lambda/4 + m\lambda/2 \pm \lambda/8 \quad (m=0, 1, 2, \ldots).$$

8. A semiconductor device having a thin film resistor comprising:
    a semiconductor substrate;
    a thin film resistor disposed on said semiconductor substrate;
    a first passivation film comprising a silicon nitride film and formed on said thin film resistor; and
    a silicon oxide film formed on said thin film resistor interposing said first passivation film, having a smaller refractive index than said first passivation film,
    wherein a thickness of said silicon oxide film is approximately 183 nm.

9. A semiconductor device having a thin film resistor comprising:
    a semiconductor substrate;
    a thin film resistor disposed on said semiconductor substrate;

a first passivation film composed of multiple layers comprising a silicon oxide film and a silicon nitride film, said first passivation film formed on said thin film resistor; and a silicon oxide film formed on said thin film resistor interposing said first passivation film, having a smaller refractive index than said first passivation film, wherein a thickness of said silicon oxide film is approximately 183 nm.

10. A semiconductor device having a thin film resistor comprising:

a semiconductor substrate;

a thin film resistor disposed on said semiconductor substrate;

a first passivation film formed on said thin film resistor; and a second passivation film formed on said thin film resistor interposing said first passivation film, having a smaller refractive index than said first passivation film, wherein a thickness d of said second passivation film satisfies the following expression when a refractive index of said second passivation film is n and a wavelength of laser beams for adjustment a resistance value of said thin film resistor is $\lambda$ $$nd=\lambda/4+m\lambda/2\pm\lambda/8 \ (m=0, 1, 2, \dots).$$

11. A semiconductor device having a thin film resistor comprising:

a semiconductor substrate;

a thin film resistor comprising chromium (Cr) and silicon (Si) disposed on said semiconductor substrate, said thin film resistor having a laser-trimmed region;

a first passivation film formed on said thin film resistor; and a second passivation film formed on said first passivation film, having a smaller refractive index than said first passivation film, thereby to restrain a reflection of a laser beam on a surface of said first passivation film, wherein said first passivation film comprises a silicon nitride film and said second passivation film comprises a silicon oxide film.

12. A semiconductor device according to claim 11, wherein said first passivation film further comprises a silicon oxide film under said silicon nitride film.

13. A semiconductor device according to claim 12, wherein said second passivation film has a thickness of approximately 183 nm.

14. A semiconductor device having a thin film resistor comprising:

a semiconductor substrate;

a thin film resistor disposed on said semiconductor substrate;

a first passivation film composed of multiple layers comprising a silicon oxide film and a silicon nitride film formed on said thin film resistor; and a second passivation film formed on said thin film resistor interposing said first passivation film, having a smaller refractive index than said first passivation film.

15. The semiconductor device according to claim 14, wherein said second passivation film is a silicon oxide film.

16. The semiconductor device according to claim 15, wherein a thickness of said second passivation film is approximately 183 nm.

17. The semiconductor device according to claim 15, wherein said semiconductor substrate has a semiconductor layer formed through a insulating film on a substrate.

18. The semiconductor device according to claim 17, wherein said semiconductor layer has a high impurity concentration region provided in the semiconductor layer and under said thin film resistor.

* * * * *